(12) United States Patent
Lee et al.

(10) Patent No.: US 7,869,271 B2
(45) Date of Patent: Jan. 11, 2011

(54) METHOD OF TESTING PRAM DEVICE (75) Inventors: Chang-Soo Lee, Yongin-si (KR); Hyung-Rok Oh, Hwaseong-si (KR); Beak-Hyung Cho, Hwaseong-si (KR); Kwang-Jin Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/787,571

(22) Filed: May 26, 2010

(65) Prior Publication Data

US 2010/0232218 A1    Sep. 16, 2010

Related U.S. Application Data

(62) Division of application No. 11/953,146, filed on Dec. 10, 2007, now Pat. No. 7,751,232.

(30) Foreign Application Priority Data

Dec. 14, 2006    (KR) ...................... 10-2006-0127851

(51) Int. Cl.
*G11C 11/00* (2006.01)

(52) U.S. Cl. ........................ 365/163; 365/200; 365/201; 365/230.03

(58) Field of Classification Search ................. 365/163, 365/148, 200, 201, 189.07, 230.03
See application file for complete search history.

(56) References Cited

U.S. PATENT DOCUMENTS

| 6,487,113 | B1 | 11/2002 | Park et al. |
| 6,687,153 | B2 * | 2/2004 | Lowrey ...................... 365/163 |
| 7,206,216 | B2 | 4/2007 | Osada et al. |
| 7,324,371 | B2 | 1/2008 | Khouri et al. |
| 7,522,449 | B2 | 4/2009 | Ro et al. |
| 7,529,124 | B2 | 5/2009 | Cho et al. |

* cited by examiner

*Primary Examiner*—David Lam
(74) *Attorney, Agent, or Firm*—Volentine & Whitt, PLLC (57) ABSTRACT

A method of testing PRAM devices is disclosed. The method simultaneously writes input data to a plurality of memory banks by writing set data to a first group of memory banks and writing reset data to a second group of memory banks, performs a write operation test by comparing data read from the plurality of memory banks with corresponding input data, and determines a fail cell in relation to the test results.

4 Claims, 6 Drawing Sheets

| Flag (1bit) | Fail Bank (4bit) | Fail I/O (16bit) |
|---|---|---|
| 0:Pass 1:Fail | 0000 : Bank0<br>0001 : Bank1<br>⋮<br>1110 : Bank14<br>1111 : Bank15 | 0000 0000 0000 0000 : All Pass<br>0000 0000 0000 0001 : IO15<br>⋮<br>1000 0000 1000 0000 : IO0, IO8<br>1111 1111 1111 1111 : All Fail |

METHOD OF TESTING PRAM DEVICE

CROSS-REFERENCE TO RELATED APPLICATIONS

This is a divisional of application Ser. No. 11/953,146 filed on Dec. 10, 2007, which claims the benefit of Korean Patent Application No. 10-2006-0127851, filed Dec. 14, 2006. The subject matter of both of these applications is hereby incorporated by reference.

BACKGROUND OF THE INVENTION

1. Field of the Invention

The present invention relates to a method for testing a phase-change random access memory (PRAM) device. More particularly, the invention relates to a method for testing a PRAM device which writes set data and reset data simultaneously and thereafter tests the outcome of writing such data.

2. Discussion of Related Art

Semiconductor memory devices are fundamentally characterized by their ability to write (or store) data and read (or retrieve) data. In order to accomplish these operations, every memory cell used to store data in the memory cell array forming the semiconductor memory device must function properly. This presents a significant challenge since contemporary semiconductor devices often include literally billions of individual memory cells. While the number of inoperative memory cells (hereafter referred to as "fail cells") is very low given the well developed fabrication processes used to manufacture semiconductor memory device, some almost always exist in the memory cell array. It is therefore necessary to identify all of the fail cells in a semiconductor memory device before its use in order to fix or replace each fail cell. Thus, accurate memory cell testing is required to ensure reliable operation of semiconductor memory devices.

During read/write function testing of a semiconductor memory device, each individual memory cell will be determined to be either a properly operating memory cell (hereafter referred to as a "pass cell") or fail cell. Unfortunately, sequentially testing millions (or billions) of individual memory cells requires a great deal of time, but practical commercial considerations demand high testing productivity at relatively low cost. Therefore, as contemporary semiconductor memory devices increase in integration density, it is important to maximize the efficiency of applied test procedures.

Semiconductor testing is accomplished using a variety of apparatuses and methods. Many of these apparatuses and methods have been developed to improve testing efficiency. As a general rule, most test apparatuses and methods applied to semiconductor memory devices use some form of parallel bit testing (i.e., test signals and/or test data are applied to more than one memory cell simultaneously).

Many parallel test methods applied to memory cells use well known logic circuits, such as the exclusive OR (XOR) or exclusive NOR (XNOR). During parallel test procedures, "like data" (i.e., logically identical data values) is written to a plurality of memory cells, and then a logic operation is performed using an XOR or XNOR logic circuit when reading the stored data from the plurality of memory cells. When like data is read, a pass cell condition is determined for the memory cells being tested. However, when different data is read, a fail cell condition is determined. By effectively testing multiple memory cells in a single logic operation, overall test time is reduced.

Recent commercial demands have motivated the development of non-volatile memory devices that enjoy high performance and low power consumption. Such non-volatile memory devices do not require the refresh operation most commonly associated with conventional DRAM. One example of next generational memory devices is the so-called phase-change random access memory (PRAM). The PRAM uses a phase-change material of variable resistance to store data.

Phase-change materials currently used to implement PRAMs include certain chalcogenides that are characterized by a resistance that changes with material state under the influence of temperature. One commonly used phase-change material is $Ge_xSb_yTe_z$ (hereinafter, referred to as "GST") which is an alloy of germanium (Ge), antimony (Sb) and tellurium (Te).

These types of phase-change materials have multiple material states (e.g., crystalline and amorphous) that may be quickly switched between by application of a defined temperature or temperature range over time. The desired phase changing temperature may be applied to the phase-change material forming PRAM using the joule heating effect of an applied electrical current.

In the description that follows, it is assumed that a phase-change material implementing a PRAM is characterized by a relatively high resistance in an amorphous state and a relatively low resistance in a crystalline state. It is further assumed that the amorphous state of the phase-change material corresponds to a reset data value (or a logical '1' value) and the crystalline state corresponds to a set data value (or a logical '0' value).

An exemplary write operation for a PRAM device will now be described under these working assumptions.

To write a reset data value of '1' (hereafter, a '1') in a specific memory cell, current is passed through the constituent phase-change material. After the phase-change material is heated to its melting point or above, it is rapidly cooled. This application of joule heating places the phase-change material in the amorphous state and stores a '1'. The amorphous state is thus referred to as the reset data state.

To write a '0' in a specific memory cell, a current is passed through the constituent phase-change material. After the phase-change material is heated to its crystallization temperature or above, it is maintained for a predetermined period of time and is then cooled relatively slowly. This application of joule heating places the phase-change material in the crystalline state and stores a '0'. The crystalline state is referred to as the set data state.

During a read operation, a specific memory cell is first selected by the conventional application of control voltages to corresponding word and bit lines. An externally applied current is then passed through the selected memory cell. A data value of '1' or '0' is sensed in relation to a difference in voltage change resulting from the current resistance state of the phase-change material.

The testing of high density PRAM devices presents many of the same challenges associated with other types of semiconductor memory devices. It is necessary to apply test methods that reduce power consumption and testing time while also reliability testing each and every memory cell in the PRAM memory cell array. However, the differences between write and read operations applied to PRAM as compared with other forms of memory, such as DRAM must be considered in the development of effective test methods.

SUMMARY OF THE INVENTION

In one embodiment, the invention provides a method for testing a phase-change random access memory (PRAM) device comprising a plurality of memory banks, each including a plurality of memory cells, comprising; simultaneously writing input data to the plurality of memory banks by writing set data to a first group of memory banks and writing reset data to a second group of memory banks, performing a write operation test by comparing data read from the plurality of memory banks with corresponding input data, and determining a fail cell in relation to the test results.

In another embodiment, the invention provides a method for testing a phase-change random access memory (PRAM) device comprising a plurality of memory banks respectively including a plurality of memory cells, comprising: writing set data to a first group of memory banks during a defined period of time, and during the defined period of time but following a delay after beginning the writing of set data, writing reset data to a second group of memory banks; performing a write operation test by comparing data read from the plurality of memory banks with corresponding input data; and determining a fail cell in relation to the test results.

In another embodiment, the invention provides a method for testing a phase-change random access memory (PRAM) device comprising a plurality of memory banks, each including a plurality of memory cells, comprising; simultaneously writing input data to the plurality of memory banks by writing inverted input data to a first group of memory banks and writing non-inverted data to a second group of memory banks, performing a write operation test by comparing data read from the plurality of memory banks with corresponding input data to generate verification results, and determining a fail cell in relation to the verification results.

DESCRIPTION OF EMBODIMENTS

The present invention will now be described in some additional detail with reference to the accompanying drawings. The invention may, however, be embodied in many different forms and should not be construed as being limited to only the exemplary embodiments set forth herein. Rather, the embodiments are presented as teaching examples.

Figure 1:
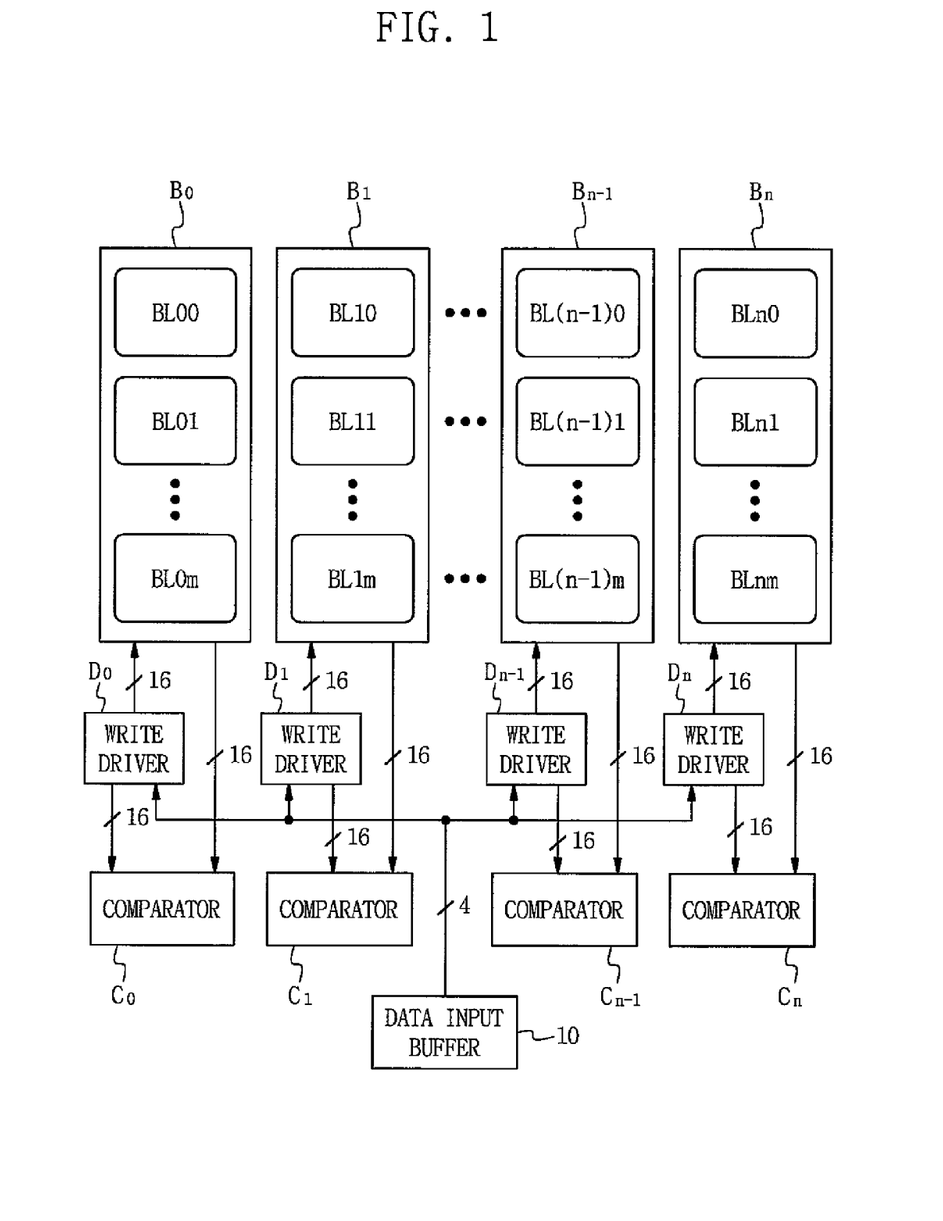
FIG. 1 is a partial block diagram illustrating the testing of a phase-change random access memory (PRAM) device according to an embodiment of the invention.

FIG. 1 is a block diagram illustrating a method of testing a phase-change random access memory (PRAM) device according to an embodiment of the invention.

The illustrated PRAM device includes a plurality of memory blocks BL00~BLnm, each including a plurality of PRAM memory cells and being arranged in a plurality of memory banks B0~Bn. Write drivers D0~Dn are used to apply input data (i.e., data to be written) received from data input buffer 10 to the memory cells. Sense amplifiers (not shown) are used to read data from the memory cells. Comparators C0~Cn are used to compare the read data and the input data.

Each of the memory banks B0~Bn is formed from "m" memory blocks. Each memory block may be conventionally configured from a predetermined number of phase-change memory cells connected to shared word lines and column selection lines. Each memory block may also include specialized circuits adapted to the testing and repair of constituent memory cells. It is assumed for purposes of explanation that each memory cell in the various memory blocks includes a diode structure connected to a variable resistance element, or a transistor connected to a variable resistance element. The sense amplifiers used to read data from the memory cells may be included within the regions allocated to the respective memory banks B0~Bn.

Comparators C0~Cn compare read data received from the sense amplifiers with corresponding input data to determine whether the input data and the read data are identical. In this regard, each comparator C0~Cn comprises at least one XNOR or XOR logic circuit comparing these data. Such logic gate comparison may be performed as part of well understood parallel bit testing. For example, when input data is defined as set data and an output value of '1' is generated by an XOR circuit within a comparator, it will be determined that a fail cell exists in relation to tested memory cells.

One exemplary testing method will now be described. In this example, data is input through four input/output lines I/O and then internally expanded across sixteen I/O lines by the write drivers D0~Dn. Sixteen bits of test data are applied to the memory banks B0~Bn and written to the memory cells in each memory bank. Thus, write operation testing may be performed through each of the sixteen I/O lines. Write operation testing may be performed for all of the memory banks B0~Bn simultaneously, or it may be performed for a group of selected memory banks, and sequentially thereafter for another group of selected memory banks until all memory banks have been tested.

Of note, it is common to designate one memory bank as a repair memory bank and logically divide it into a plurality of repair units. Each repair unit within the repair memory bank may undergo write operation testing along with the other (normal data) memory banks.

Write operation testing may be conducted in relation to input data that is all set data, all reset data, or a combination of set data and reset data. When the input data is formed from a combination of set data and reset data, the comparators C0~Cn may be varied in their internal constitution. That is, the constitution of the comparators C0~Cn may vary to compare each bit of input data with a corresponding bit of read data to yield a comparison result.

Writing operation testing usually includes a write verification mode. As the verification mode is executed to ensure the reliability execution of the write operation, it may be included as part of the write operation testing performed in accordance with an embodiment of the invention.

Figure 2:
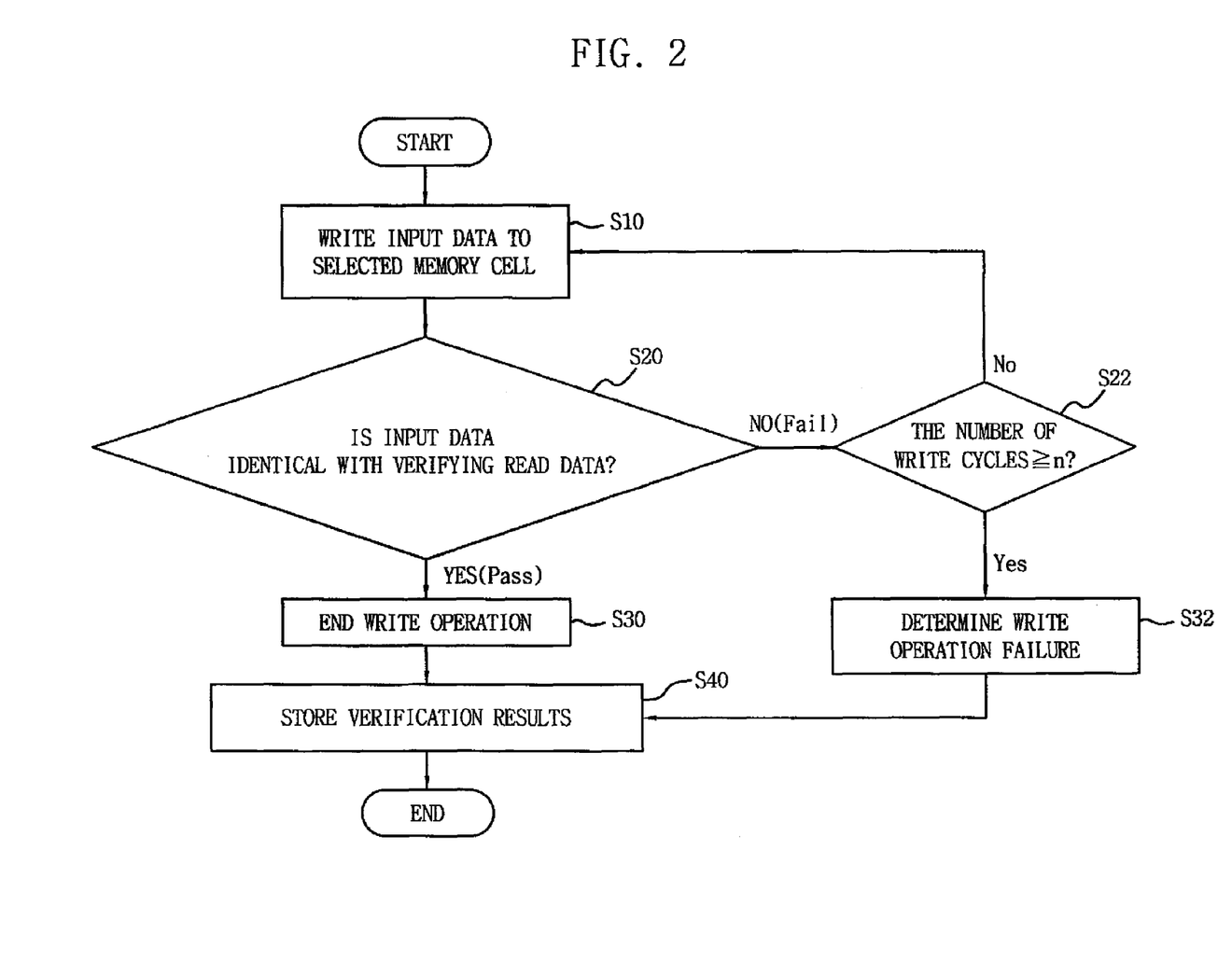
FIG. 2 is a flow chart further illustrating the test method being applied in FIG. 1.

FIG. 2 is a flow chart illustrating a write operation testing method including a verification mode.

Upon start, at least one selected memory cell has input data written to it (S10). For example, where write operations are performed through the sixteen I/O lines, 16 bits of input data are written to respective memory cells. The input data may be set data, reset data, or a combination of both.

Subsequently, a verifying read operation is performed to verify the data actually stored in the selected memory cell (S20). The verifying read operation may include reading stored data from each selected memory cell, and comparing the read data bit for bit with corresponding input data to determine whether the verifying read data is identical to the input data.

If the verifying read data is identical with the input data (i.e., a "pass condition" is indicated), the write operation ends (S30). Alternately, if the verifying read data is different from the input data (i.e., a "fail condition" is indicated), the write operation continues. It is common to write data into non-volatile memory devices over a sequence of write cycles. A maximum number of write cycles "n" is defined for each particular memory device.

Consistent with this approach, the exemplary method determines in a fail condition whether the maximum number of write cycles (e.g. 11 cycles) has been reached (S22). If not (S22=no), the write operation returns to the input data writing step (S10). This loop may be followed until the selected memory cells are properly programmed, or until the maximum number of write cycles is reached.

Once the maximum number of write cycles has been reached (S22=yes), a write failure is determination (S32). A write failure determination (S32) as well as a pass condition determination (S20=Pass) are each followed by a step of storing verification results (S40).

That is, whether a memory cell is determined to be a pass cell (S20=Pass) or a fail cell (S32) by comparison of input data with actually stored data, the verification results may be stored in a register internal to or accessible by the PRAM.

In this case, the comparators C0~Cn are used only when comparing data during the read verification operation. The final outcome of the test operation may be determination by reference to the internal register.

Figure 3:
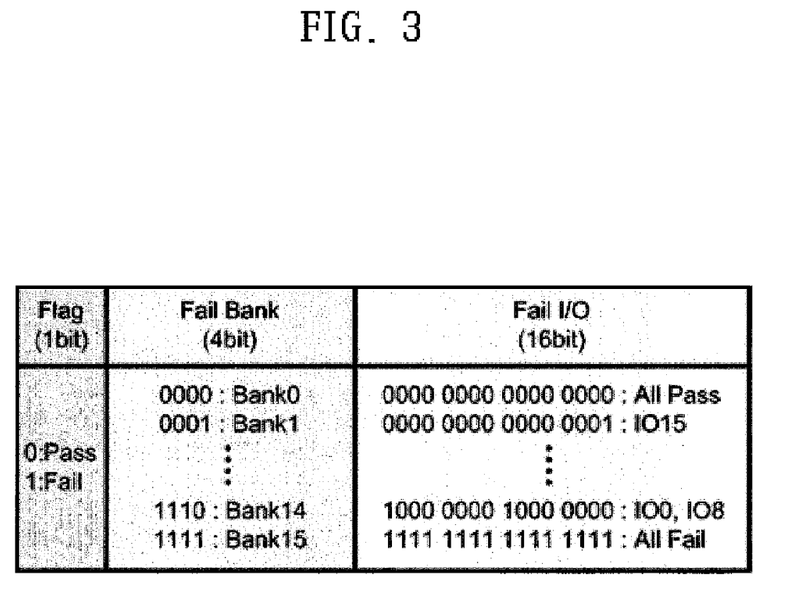
FIG. 3 is a table illustrating an example of verification results stored in an internal register.

FIG. 3 shows an example of verification results for a PRAM including multiple memory banks stored in an internal register.

In the example of FIG. 3, bit by bit verification results are indicated for the write test operation. That is, flag values are used to distinguish fail cells from pass cells. For example, in Bank 0, all memory cells pass. In Bank 1, a single fail cell associated with the 15th I/O line is indicated. In Bank 14, fail cells associated with the 0th and 8th I/O lines are indicated.

According to the illustrated embodiment of the invention, conventional repair operations (e.g., connection of replacement cells) may be performed to correct the identified fail cells in accordance with information contained in the internal register.

In conventional test operations, a normal read operation is performed following a write operation. When normal read data is output, the normal read data is compared with the input data, to determine whether any memory cell failure has occurred. However, in embodiments of the invention, since the normal read operation may be omitted, test operation may be performed more quickly.

Figure 4:
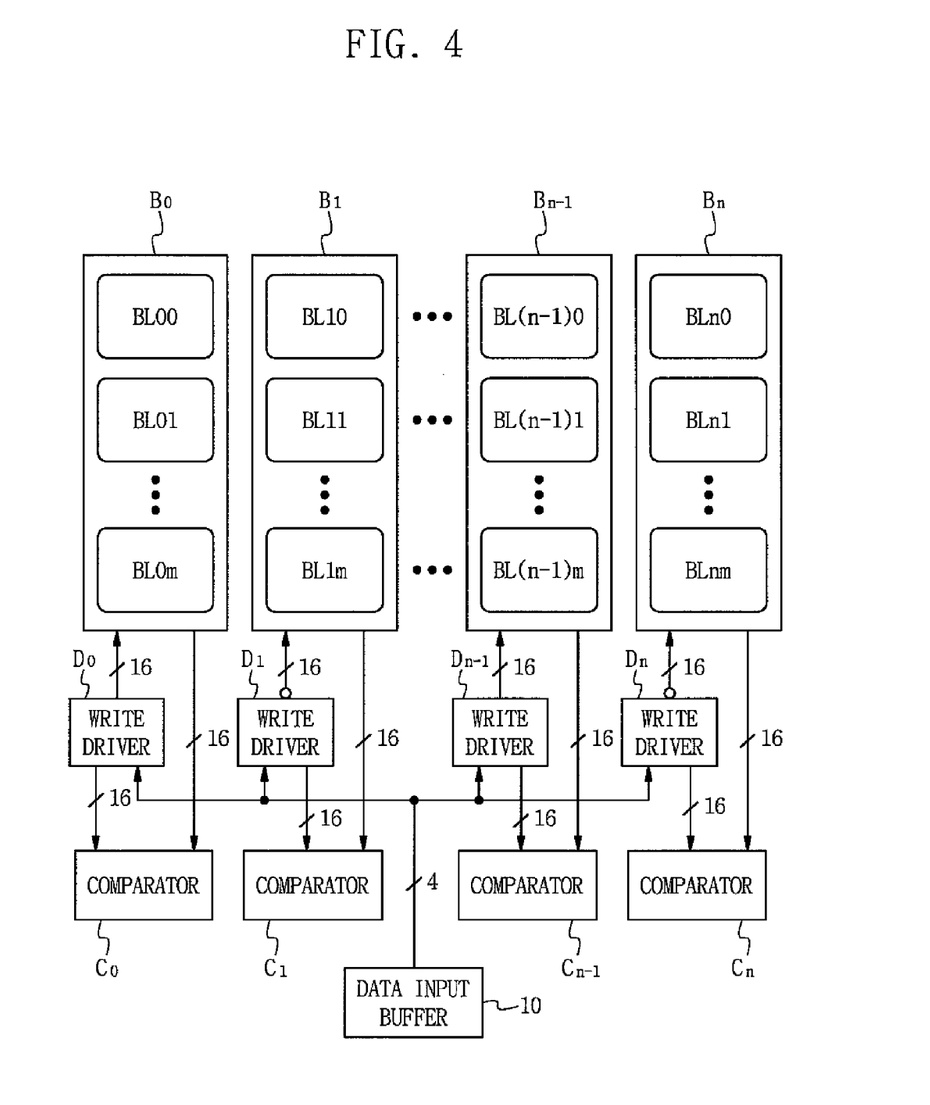
FIG. 4 is a partial block diagram illustrating the testing of a PRAM device according to another embodiment of the invention.

FIG. 4 is a partial block diagram illustrating a method of testing a PRAM device according to another embodiment of the invention. The block diagram of FIG. 4 is similar to the block diagram of FIG. 1, except for the provision of certain inverter circuits associated with selected write drivers (e.g., D1 and Dn). These inverter circuits may be needed to invert input data applied to certain memory banks, and may be conventionally implemented.

During a test operation, input data may be applied through four I/O lines and internally expanded to sixteen I/O lines by the write drivers D0~Dn. The input data is then written to the respective memory banks with certain input data being inverted in the process. Assuming all set or all reset input data values are received from data input buffer 10, one group of memory banks will receive the input data while another group of memory banks will receive the logical inverse.

This group global selective inversion has the effect of reducing a current consumption during the write operation testing without mandating a particular form of input data. That is, when it is assumed that the current of 1 mA is needed to write the reset data in the latest PRAM device, it is known that the current of 0.5 mA is needed to write the set data. Therefore, when all reset data is written through the sixteen I/O lines to sixteen memory banks, current consumption will be 16*16*1 mA, or about 256 mA. To reduce power consumption, the inverted data of the input data is written to only a portion (e.g., half) of the total memory banks. For example, when the input data is 'FFFF', 'FFFF' is written to zero bank B0 and '0000 ' which are the inverted data is written to first bank B1. Then, the current consumption for the write operation is reduced to 16*8*1 mA+16*8*0.5 mA, or about 192 mA.

The definition of first and second memory bank groups receiving respectively input data and inverted input data is a matter of design choice. Alternate memory blocks grouping is just one possible example.

The write verification operation associated with the embodiment illustrated in FIG. 2 may also be performed in like manner in the embodiment illustrated in FIG. 4. Here, the inverted/non-inverted nature of the input data must be accounted for in the comparison process. Verification results are again stored in an internal register. Repair operations may be performed based on the information stored in the internal register, thereby reducing test time over test methods requiring a subsequent normal read operation.

Figure 5:
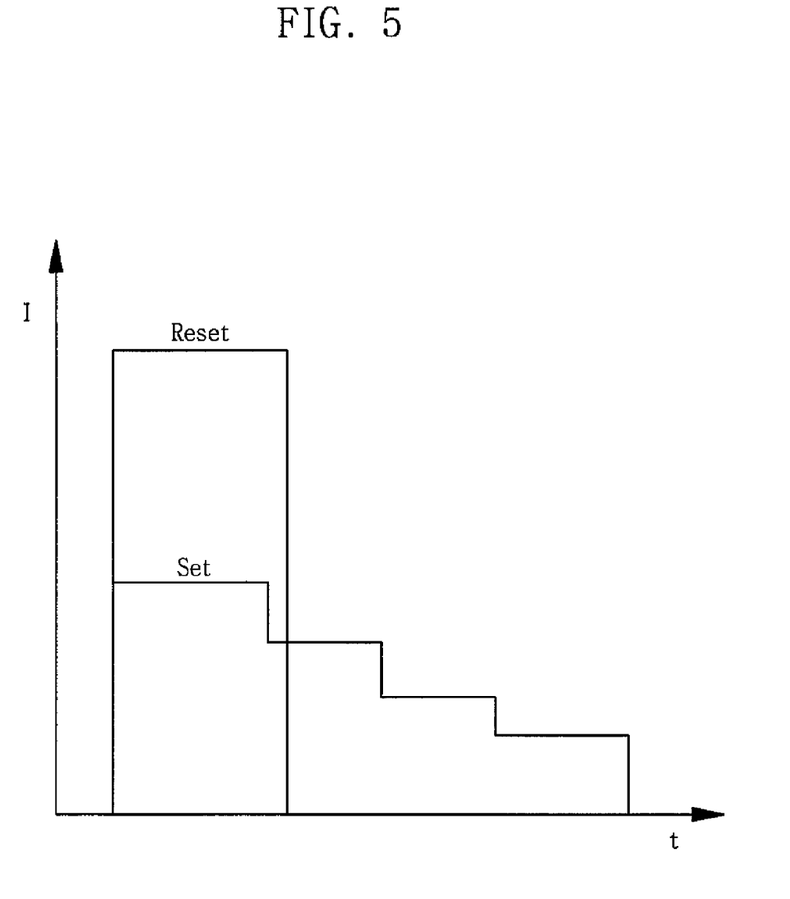
FIG. 5 is a graph illustrating set pulse and reset pulse waveforms conventionally applied during write operation testing.
Figure 6:
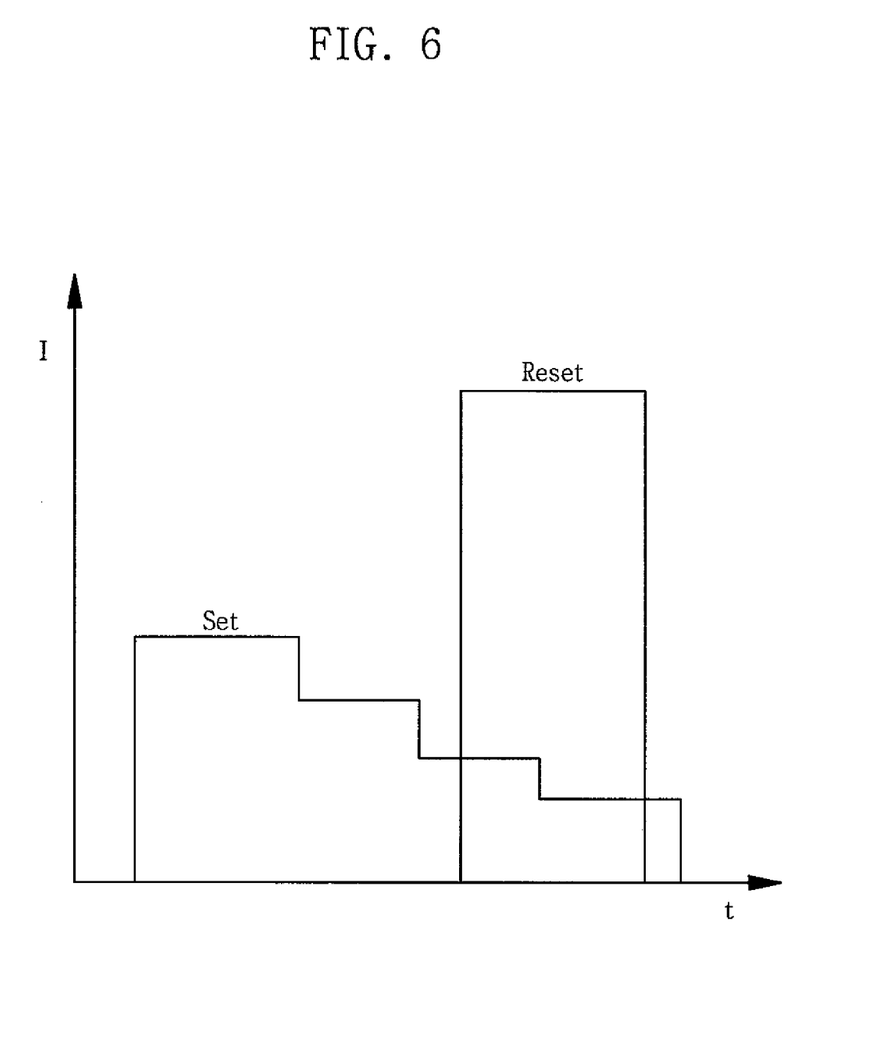
FIG. 6 is a graph illustrating set pulse and reset pulse waveforms which are applied during write operation testing according to an embodiment of the invention.

FIGS. 5 and 6 are graphs illustrating respective set and reset pulses applied to define a material state for PRAMs being testing conventionally and PRAMs being tested in accordance with an embodiment of the invention.

FIG. 5 shows the set and reset pulses for the conventional write operation. FIG. 6 shows the set and reset pulses for a write operation according to the embodiment of the invention.

As shown in FIGS. 5 and 6, upon comparing current levels, generally the peak current level of the set pulse (Set) is lower than the peak current level of the reset pulse (Reset). Further, upon comparing an application time of a current, the application time of the set pulse is relatively longer than the application time of the reset pulse. Further, the level of the reset pulse is fixed during the application period while the level of the set pulse gradually decreases over time.

As illustrated in FIG. 5, when set data and reset data are written simultaneously during a conventional write operation, the application time of the set pulse and the reset pulse occur together. That is, the write operation is performed by applying the set pulse and the reset pulse at the same beginning point in time. In this case, since the reset pulse is applied when the current level of the set pulse is relatively high, the overall peak current demand increases.

In FIG. 6, the reset pulse is applied later in the period during which the set pulse is applied. As a result, the overall peak current demand is reduced, thereby reducing current consumption. That is, after a predetermined delay following the start of the set pulse its level will have been reduced. With the set pulse as a relatively lower level following this delay, the reset pulse Reset is applied, thereby reducing current consumption.

In this case, it is most suitable to apply the reset pulse at a point near the termination of the set pulse. The exact point during the set pulse that the reset pulse is applied is, however, a matter of design choice and will be made after considering the efficiency of the write operation and the precision with which pulse applications can be defined.

As described above, the test method according to the present invention has the advantages of reducing overall test time and the current consumption required to perform the test operation.

In the context of the foregoing embodiments, since a verification mode is necessarily included within the test operation, the reliability of the test operation may be improved. Further, during a write operation using set and reset data, the application of corresponding pulses may be differentiated and/or the applied input data may be group inverted in order to reduce current consumption. Consequently, an effective test method may be provided.

The invention has been described in the context of exemplary embodiments. However, it is to be understood that the scope of the invention is not limited to only these embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A method for testing a phase-change random access memory (PRAM) device comprising a plurality of memory banks respectively including a plurality of memory cells, comprising:

writing set data to a first group of memory banks during a defined period of time, and during the defined period of time but following a delay after beginning the writing of set data, writing reset data to a second group of memory banks;

performing a write operation test by comparing data read from the plurality of memory banks with corresponding input data; and determining a fail cell in relation to the test results.

2. The method according to claim 1, wherein the writing set data comprises; applying a set pulse during the defined period of time, wherein the set pulse defines a current having a relatively high initial level and a gradually descending level thereafter.

3. The method according to claim 2, wherein the writing reset data comprises; applying a reset pulse during a portion of the defined time period, wherein the reset pulse is shorter in duration than the set pulse and defines a current having a higher maximum level than the current defined by the set pulse.

4. The method according to claim 3, wherein application of the reset pulse occurs near the end of the defined time period.

* * * * *